(12) United States Patent
Cicalini

(10) Patent No.: US 7,646,236 B2
(45) Date of Patent: Jan. 12, 2010

(54) METHOD AND APPARATUS FOR TUNING RESISTORS AND CAPACITORS

(75) Inventor: Alberto Cicalini, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 227 days.

(21) Appl. No.: 11/399,987

(22) Filed: Apr. 7, 2006

(65) Prior Publication Data

US 2007/0236281 A1   Oct. 11, 2007

(51) Int. Cl.
*H04B 1/10* (2006.01)
(52) U.S. Cl. .................................... 327/553
(58) Field of Classification Search ............ 327/336, 327/337, 344, 345, 551–559
See application file for complete search history.

(56) References Cited

U.S. PATENT DOCUMENTS

| | | | |
|---|---|---|---|
| 4,791,379 A * | 12/1988 | Hughes | 327/554 |
| 6,259,311 B1 * | 7/2001 | Azimi et al. | 327/553 |
| 6,417,737 B1 | 7/2002 | Moloudi et al. | |
| 6,549,066 B1 * | 4/2003 | Martin | 327/552 |
| 6,968,167 B1 * | 11/2005 | Wu et al. | 455/251.1 |
| 7,031,456 B2 * | 4/2006 | Dyer et al. | 379/398 |
| 7,078,961 B2 * | 7/2006 | Punzenberger et al. | 327/553 |
| 7,324,615 B2 * | 1/2008 | Lourens et al. | 375/343 |
| 7,425,863 B2 * | 9/2008 | Gatta et al. | 327/558 |
| 2005/0118980 A1 | 6/2005 | Pai et al. | |

OTHER PUBLICATIONS

International Searh Report—PCT/US07/066097—International Search Authority—European Patent Office—Dec. 6, 2007.
Written Opinion—PCT/US2007/066097, Internationals Earch Authority—European Patent Office—Dec. 6, 2007.
International Preliminary Report—On Patentability—PCT/US2007/066097, International Search Authority—The International Search Bureau of WIPO—Geneva. Switzerland—Oct. 8, 2008.

* cited by examiner

*Primary Examiner*—Lincoln Donovan
*Assistant Examiner*—Patrick O'Neill
(74) *Attorney, Agent, or Firm*—Jiayu Xu

(57) ABSTRACT

A two-step tuning process for resistors and capacitors in an integrated circuit is described. In the first step of the tuning process, an on-chip adjustable resistor is tuned based on an external resistor to obtain a tuned resistor. The value of the tuned resistor is accurate to within a target percentage determined by the external resistor and the design of the adjustable resistor. In the second step, an adjustable capacitor is tuned based on the tuned resistor and an accurate clock to obtain a tuned capacitor having an accurate value. The adjustable capacitor may be tuned such that an RC time constant for the tuned resistor and the tune capacitor is accurate to within a target percentage determined by the accurate clock and the design of the adjustable capacitor. The resistors and capacitors of other circuits on the integrated circuit may be adjusted based on the tuned resistor and the tuned capacitor, respectively.

24 Claims, 7 Drawing Sheets

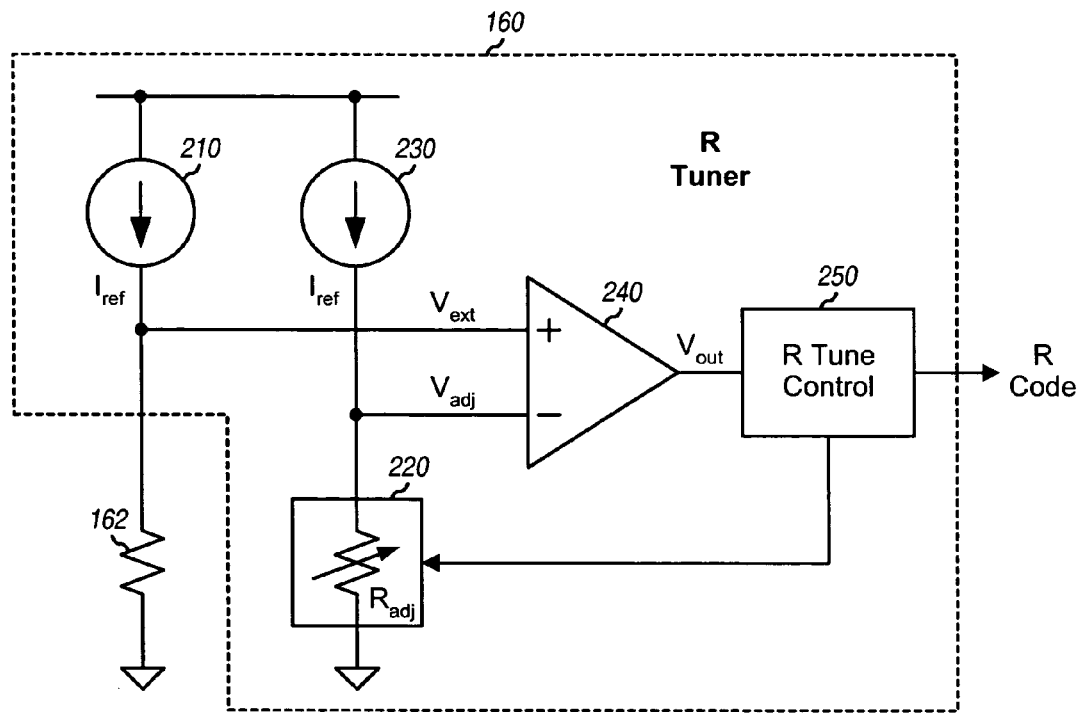
FIG. 2
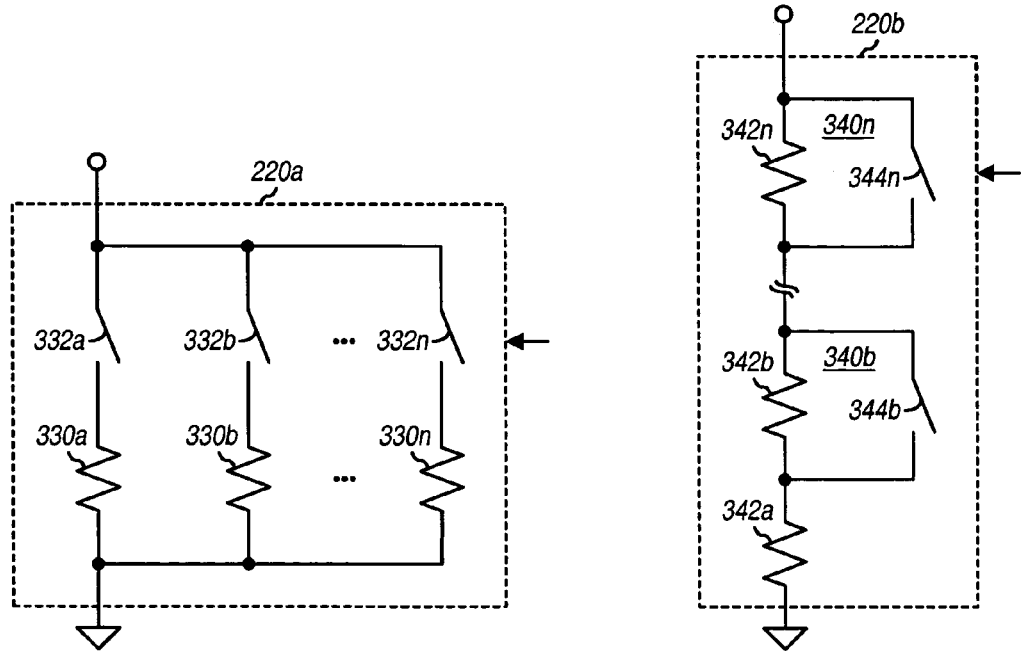
FIG. 3A             FIG. 3B

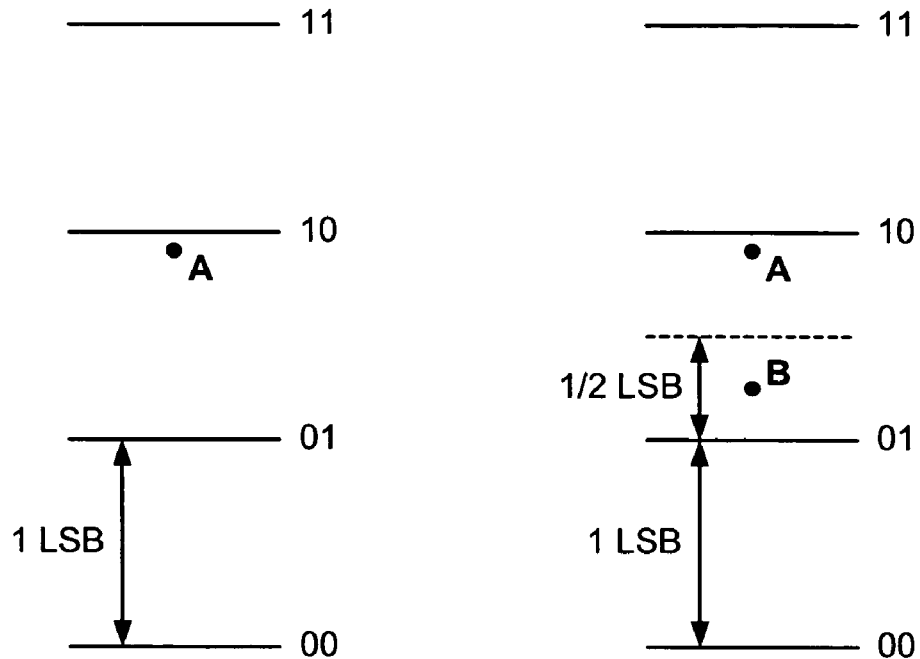
FIG. 6A    FIG. 6B
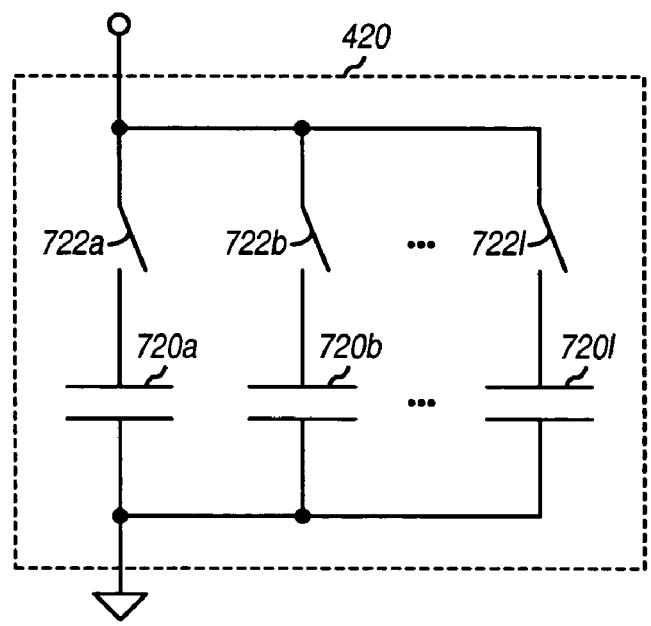
FIG. 7

METHOD AND APPARATUS FOR TUNING RESISTORS AND CAPACITORS

BACKGROUND

I. Field

The present disclosure relates generally to electronics, and more specifically to techniques for tuning resistors and capacitors.

II. Background

Resistors (R) and capacitors (C) are circuit components that are widely used in various types of circuits. For example, resistors and capacitors are commonly used in active RC filters, amplifiers, mixers, and so on. Resistors and capacitors are also fabricated on various integrated circuits (ICs) such as analog ICs and radio frequency ICs (RFICs).

Resistors and capacitors in a given circuit typically have specific values that are selected based on the requirements of the circuit. For example, in an active RC filter, the 3 dB bandwidth of the filter is determined by an RC product. Hence, the nominal values of resistors and capacitors in the filter are selected to achieve the RC product. However, the actual value of an on-chip resistor may vary by as much as 25% from the nominal R value, and the actual value of an on-chip capacitor may vary by as much as 15% from the nominal C value. The variations in resistance and capacitance are due to IC process manufacturing tolerance.

Large variations in resistance and capacitance may result in large variations in circuit characteristics and performance. As an example, the bandwidth of an active RC filter may vary by as much as −30% to +57% from the nominal bandwidth due to ±25% variation in resistance and ±15% variation in capacitance. This large variation in bandwidth is not tolerable for most applications, especially for higher order filters designed to meet stringent requirements.

Conventionally, large variations in resistance and capacitance are accounted for by adjusting only the capacitor. In one common tuning method, an RC time constant is formed by the product of an on-chip resistor and an on-chip adjustable capacitor. The RC time constant is tuned by varying the adjustable capacitor to achieve the desired RC time constant, which may be ascertained based on an accurate clock. For this tuning method, the adjustable capacitor compensates for the entire variation in resistance and capacitance, i.e., the entire spread in the RC product. To account for the worst case in which the resistor varies by −25% and the capacitor varies by −15%, the adjustable capacitor should be approximately 60% bigger than the size required if the resistor and capacitor had been constant over IC process.

Capacitors are very inefficient when fabricated in a standard silicon process since their density or capacitance per micron square is very low. Furthermore, most of the area of a circuit such as an active RC filter may be taken up by capacitors. Hence, tuning the active RC filter by adjusting only the capacitor may result in the filter area increasing by a large amount, e.g., about 60% for the example given above.

There is therefore a need in the art for techniques to account for large variations in resistance and capacitance in a more efficient manner.

SUMMARY

A two-step tuning process for resistors and capacitors in an integrated circuit are described herein. In the first step of the tuning process, an adjustable resistor is tuned based on a first reference (e.g., an accurate external resistor) to obtain a tuned resistor. The value of the tuned resistor is accurate to within a target percentage determined by the first reference and the design of the adjustable resistor. In the second step, an adjustable capacitor is tuned based on the tuned resistor and a second reference (e.g., an accurate clock) to obtain a tuned capacitor having an accurate value. The adjustable capacitor may be tuned such that an RC time constant of the tuned resistor and the tune capacitor is accurate to within a target percentage determined by the second reference and the design of the adjustable capacitor. The adjustable resistor and the adjustable capacitor may be tuned as described below. For the two-step tuning process, the adjustable resistor accounts for variations in resistance, and the adjustable capacitor accounts for variations in capacitance as well as residual errors from the resistor tuning. The resistors and capacitors of other circuits on the integrated circuit may be adjusted based on the tuned resistor and the tuned capacitor, respectively.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

FIG. 2 shows a schematic diagram of an R tuner.

FIGS. 3A and 3B show two embodiments of an adjustable resistor.

FIGS. 6A and 6B illustrate tuning to achieve ±½ LSB of accuracy.

FIG. 7 shows an embodiment of an adjustable capacitor.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
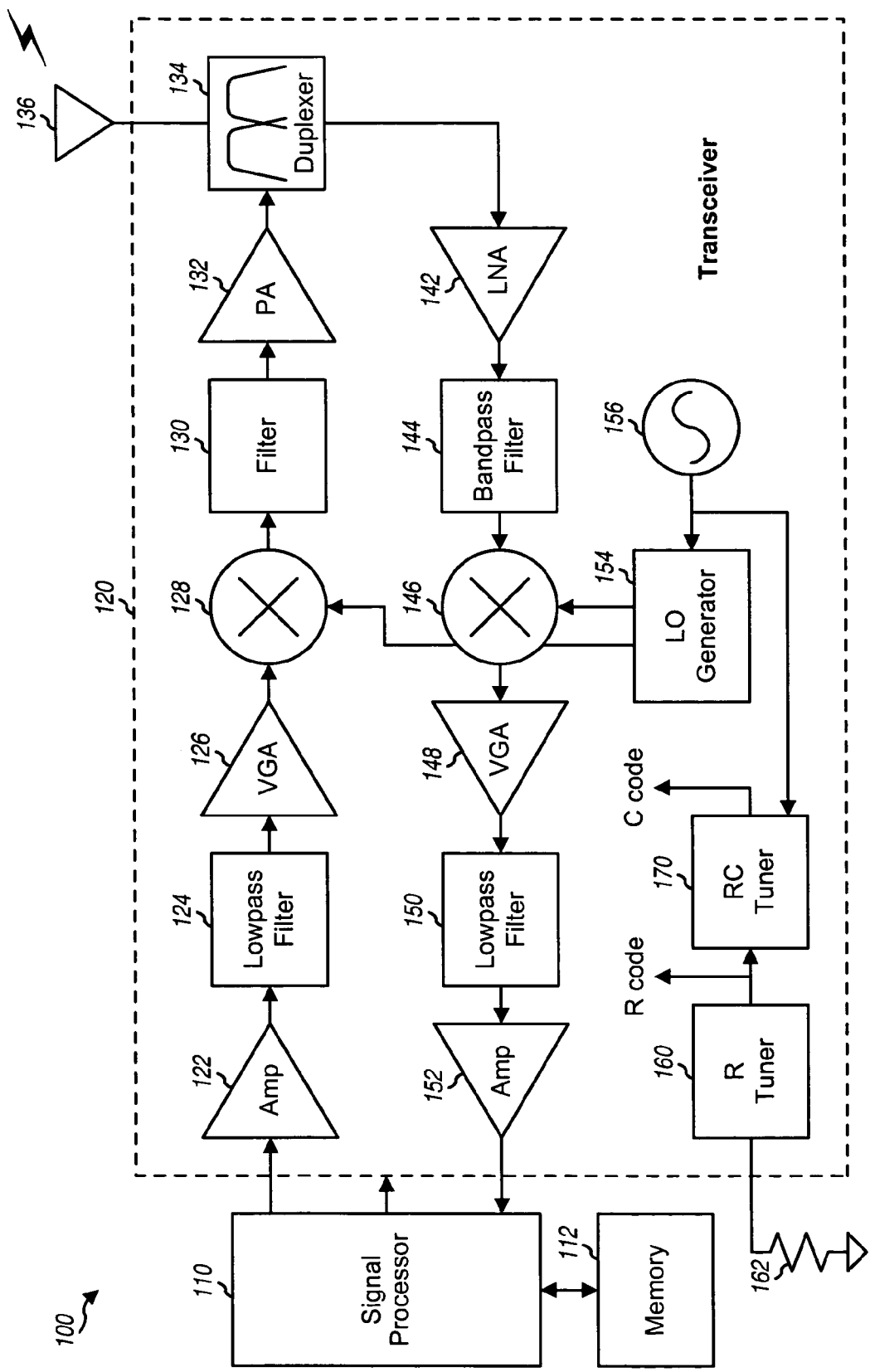
FIG. 1 shows a block diagram of a wireless device.

FIG. 1 shows a block diagram of a wireless device 100 that implements the tuning techniques and circuits described herein. Wireless device 100 may be a cellular phone, a personal digital assistant (PDA), a wireless modem, and so on. On the transmit path, a signal processor 110 processes data to be transmitted and provides an analog output signal to a transceiver 120. Within transceiver 120, the analog output signal is amplified by an amplifier (Amp) 122, filtered by a lowpass filter 124 to remove images caused by digital-to-analog conversion, amplified by a variable gain amplifier (VGA) 126, and upconverted from baseband to RF by a mixer 128. The upconverted signal is filtered by a bandpass filter 130 to remove images caused by the frequency upconversion, further amplified by a power amplifier (PA) 132, routed through a duplexer 134, and transmitted from an antenna 136.

On the receive path, an RF signal is received by antenna 136, routed through duplexer 134, amplified by a low noise amplifier (LNA) 142, filtered by a bandpass filter 144, and downconverted from RF to baseband by a mixer 146. The downconverted signal is amplified by a VGA 148, filtered by a lowpass filter 150, and amplified by an amplifier 152 to obtain an analog input signal, which is provided to signal processor 110. A local oscillator (LO) generator 154 receives a reference clock from an oscillator 156 and generates a transmit LO signal used for frequency upconversion and a receive LO signal used for frequency downconversion. Oscillator 156 may be a crystal oscillator (XO) or some other oscillator that can provide an accurate clock.

FIG. 1 shows an exemplary transceiver design. In a typical transceiver, the conditioning of the signals in the transmit and receive paths may be performed by one or more stages of amplifier, filter, mixer, and so on. These circuits may be arranged differently from the configuration shown in FIG. 1. Furthermore, other circuits not shown in FIG. 1 may also be used to condition the signals in the transmit and receive paths. Transceiver 120 may be fabricated on a single IC or multiple ICs.

In an aspect, a two-step tuning process is used to account for variations in resistance and capacitance on an integrated circuit. In the first step of the tuning process, an on-chip adjustable resistor is tuned to obtain a tuned resistor having a value that is close to a nominal resistor value. In the second step, an on-chip adjustable capacitor is tuned to obtain a tuned capacitor having a value that is close to a nominal capacitor value. The adjustable resistor may be tuned based on an accurate external resistor. The adjustable capacitor may be tuned based on the tuned resistor and an accurate clock.

The resistor tuning compensates for variations in resistance across IC process. The capacitor tuning compensates for variations in capacitance across IC process as well as residual errors in the resistor tuning. An adjustable capacitor that compensates for variations in capacitance may be much smaller than an adjustable capacitor that compensates for variations in both resistance and capacitance. For example, a capacitor that compensates for variations in capacitance may need to be 24% bigger whereas a capacitor that compensates for variations in both resistance and capacitance may need to be 60% bigger. The substantial reduction in capacitor size may result in smaller die area, lower cost, and other benefits.

In the embodiment shown in FIG. 1, an R tuner 160 tunes an on-chip adjustable resistor based on an external resistor 162 and provides an R code that indicates the setting and value of the tuned resistor. An RC tuner 170 tunes an on-chip adjustable capacitor based on the tuned resistor and the reference clock from oscillator 156 and provides a C code that indicates the setting and value of the tuned capacitor. The resistors and/or capacitors in various circuits within transceiver 120 may be adjusted based on the R code from R tuner 160 and/or the C code from RC tuner 170.

FIG. 2 shows a schematic diagram of an embodiment of R tuner 160 in FIG. 1. In this embodiment, a current source 210 is coupled in series with external resistor 162 and also to a non-inverting input of a comparator 240. A current source 230 is coupled in series with an adjustable resistor 220 and also to an inverting input of comparator 240. Comparator 240 compares the voltages at its two inputs and provides a logic output. An R tune control unit 250 adjusts the value of adjustable resistor 220 based on the logic output from comparator 240.

Current sources 210 and 230 may provide the same $I_{ref}$ current to resistors 162 and 220, respectively. Alternatively, current sources 210 and 230 may provide different amounts of current if resistors 162 and 220 have different nominal values. In any case, the $V_{ext}$ voltage across resistor 162 is dependent on the value of resistor 162 and the $I_{ref}$ current. The $V_{adj}$ voltage across resistor 220 is dependent on the value of resistor 220 and the $I_{ref}$ current. Comparator 240 compares the $V_{ext}$ and $V_{adj}$ voltages. If resistor 220 is smaller than resistor 162, then $V_{adj}$ is lower than $V_{ext}$, comparator 240 provides a logic high, and control unit 250 selects a higher value for resistor 220. Conversely, if resistor 220 is larger than resistor 162, then $V_{adj}$ is higher than $V_{ext}$, comparator 240 provides a logic low, and control unit 250 selects a lower value for resistor 220. Control unit 250 selects different values for resistor 220 until $V_{adj}$ is close to $V_{ext}$.

FIG. 3A shows a schematic diagram of an adjustable resistor 220a, which is an embodiment of adjustable resistor 220. Adjustable resistor 220a is composed of N branches that are coupled in parallel. Each branch includes a resistor 330 coupled in series with a switch 332. Different resistor values may be obtained by turning on different switches 332 and selecting different branches. In an embodiment, the values of resistors 330a through 330n are selected based on geometric progression. For example, resistor 330a may be 2% larger than resistor 330b, which may be 2% larger than the next resistor, and so on. Other values may also be selected for the resistors.

FIG. 3B shows a schematic diagram of an adjustable resistor 220b, which is another embodiment of adjustable resistor 220. Adjustable resistor 220b is composed of a resistor 342a coupled in series with N−1 sections 340b through 340n. Each section 340 includes two branches coupled in parallel, with the first branch being composed of a resistor 342 and the second branch being composed of a switch 344. One branch is selected in each section. Different resistor values may be obtained by turning on different branches in the N−1 sections. In an embodiment, the values of resistors 342b through 342n are selected based on geometric progression. For example, resistor 342b may be 2% of resistor 342a, the next resistor may be 2% larger than resistor 342b, and so on. Other values may also be selected for the resistors.

For both adjustable resistor 220a in FIG. 3A and adjustable resistor 220b in FIG. 3B, the number of resistors and the values of the resistors may be selected based on the maximum variation in resistance and the desired accuracy for the tuned resistor. For example, if the maximum variation is 25% and the desired accuracy is 2%, then 12 or 13 resistors should be sufficient to achieve 2% accuracy for the tuned resistor. Adjustable resistor 220 has a minimum value of $R_{min}$ and a maximum value of $R_{max}$.

Referring back to FIG. 2, control unit 250 may perform a linear search, a binary search, or some other search to tune adjustable resistor 220 to be close to external resistor 162. For a linear search, control unit 250 either (1) increases the value of resistor 220 in small steps until resistor 220 is larger than resistor 162 or (2) decreases the value of resistor 220 in small steps until resistor 220 is smaller than resistor 162. For example, control unit 250 may initially set resistor 220 to $R_{min}$. Control unit 250 may then determine whether resistor 220 is smaller or larger than resistor 162, select the next larger value for resistor 220 if it is smaller than resistor 162, and repeat the tuning process until resistor 220 is larger than resistor 162. For a binary search, control unit 250 adjusts resistor 220 in progressively smaller steps until all bits are evaluated. Control unit 250 may initially set resistor 220 to a mid value between $R_{min}$ and $R_{max}$. Control unit 250 may then determine whether resistor 220 is smaller or larger than resistor 162, select a larger value for resistor 220 if it is smaller than resistor 162, select a smaller value for resistor 220 if it is larger than resistor 162, and repeat the tuning process for the next bit. For both searches, after completing the search, control unit 250 provides an R code that indicates both the setting and the value of adjustable resistor 220 for a tuned resistor that is close to external resistor 162.

Figure 4:
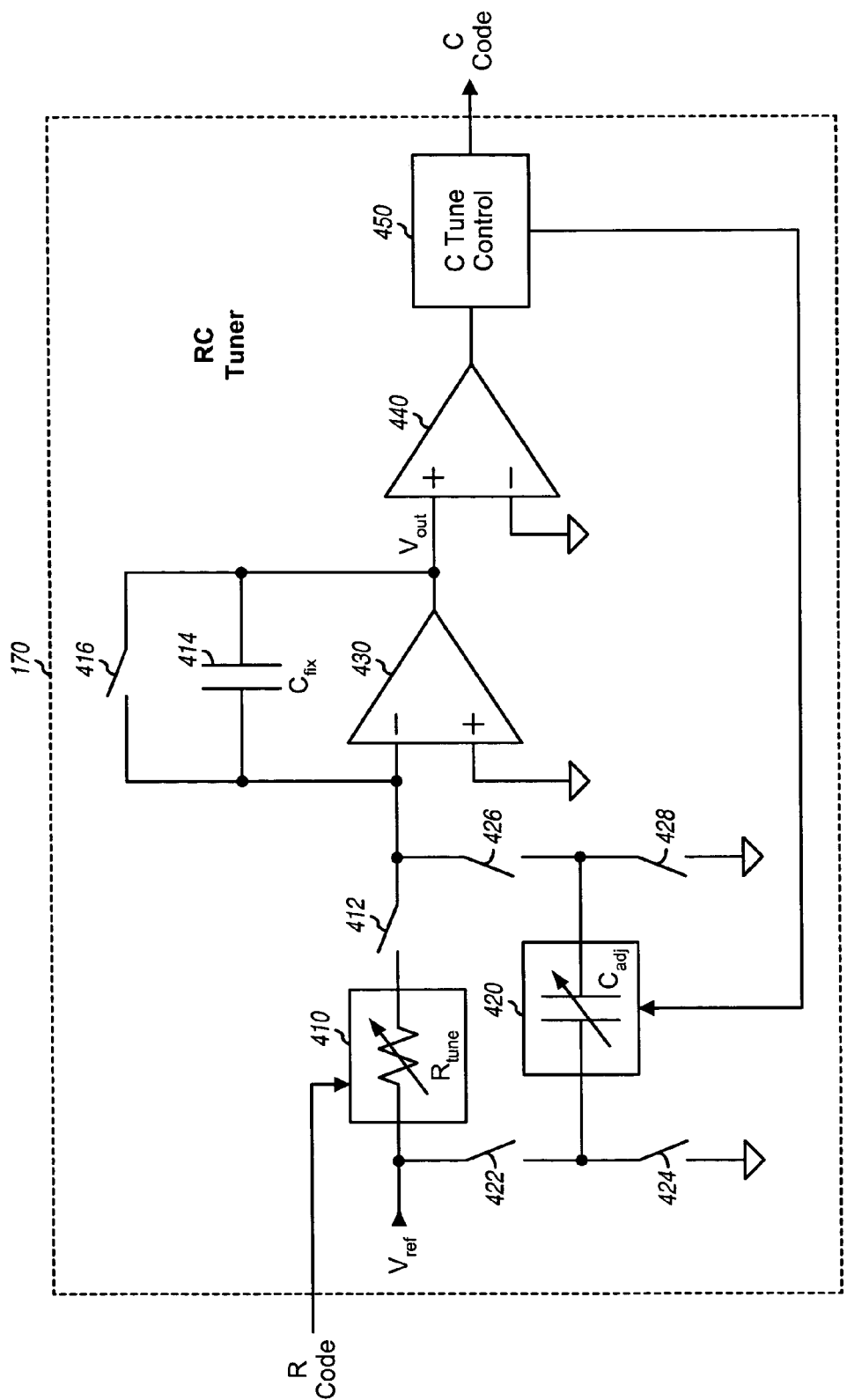
FIG. 4 shows a schematic diagram of an RC tuner.

FIG. 4 shows a schematic diagram of an embodiment of RC tuner 170 in FIG. 1. In this embodiment, a resistor 410 and a switch 412 are coupled in series between a $V_{ref}$ voltage and an inverting input of an amplifier 430. An adjustable capacitor 420 and switches 422 and 426 are coupled in series and also between $V_{ref}$ and the inverting input of amplifier 430. A switch 424 is coupled between one end of capacitor 420 and circuit ground, and a switch 428 is coupled between the other end of capacitor 420 and circuit ground. A capacitor 414 and a switch 416 are coupled in parallel and between the inverting input and the output of amplifier 430. The amplifier output is also the integrator output $V_{out}$. A comparator 440 has its non-inverting input coupled to the output of amplifier 430 and its output coupled to a C tune control unit 450. Control unit 450 adjusts the value of adjustable capacitor 420 based on the logic output from comparator 440.

RC tuner 170 implements an RC integrator and a switched capacitor integrator. The RC integrator is composed of resistor 410, capacitor 414, and amplifier 430. The switched capacitor integrator is composed of capacitors 414 and 420 and amplifier 430. The switches facilitate the operation of the two integrators. Resistor 410 is initially set to a value of $R_{tune}$, which is determined by the R code from R tuner 160 and is accurate to within a target percentage, e.g., 2 to 3%. Capacitor 414 has a value of $C_{fix}$, which does not need to be accurate. Adjustable capacitor 420 has a minimum value of $C_{min}$ and a maximum value of $C_{max}$.

The RC tuning may be performed as follows. Initially, switch 416 is closed and capacitor 414 is discharged via switch 416. The RC integrator is then enabled for a predetermined time period $T_{on}$ by closing switch 412 and opening all other switches. When the RC integrator is enabled, capacitor 414 is charged by $V_{ref}$ via resistor 410. At the end of the $T_{on}$ charge-up period, the charge $Q_c$ accumulated by capacitor 414 may be expressed as:

$$Q_c = C_{fix} \cdot V_{peak} = \frac{V_{ref}}{R_{tune}} \cdot T_{on}, \quad \text{Eq (1)}$$

where $V_{peak}$ is the voltage across capacitor 414 and also at the output of amplifier 430 at the end of the RC integration. $V_{peak}$ may be expressed as:

$$V_{peak} = \frac{V_{ref}}{R_{tune} \cdot C_{fix}} \cdot T_{on}. \quad \text{Eq (2)}$$

After charging capacitor 414 with the RC integrator, the charge collected on capacitor 414 is discharged via the switched capacitor integrator for M cycles, where $M \geq 1$. For each discharge cycle, switches 422 and 428 are initially closed, switches 424 and 426 are opened, and capacitor 420 is charged to $V_{ref}$. Switches 422 and 428 are then opened, switches 424 and 426 are closed, and capacitor 420 discharges the charge on capacitor 414. The charge $Q_d$ transferred from capacitor 414 in each discharge cycle may be expressed as:

$$Q_d = C_{adj} \cdot V_{ref} = C_{fix} \cdot V_{step}, \quad \text{Eq (3)}$$

where $V_{step}$ is the drop in the voltage across capacitor 414 as well as the output of amplifier 430 after each discharge cycle. $V_{step}$ may be expressed as:

$$V_{step} = V_{ref} \cdot \frac{C_{adj}}{C_{fix}}. \quad \text{Eq (4)}$$

If capacitor 414 is completely discharged after M discharge cycles, then the following relationships are obtained:

$$V_{peak} = V_{step} \cdot M, \quad \text{Eq (5)}$$

$$\frac{V_{ref}}{R_{tune} \cdot C_{fix}} \cdot T_{on} = V_{ref} \cdot \frac{C_{adj}}{C_{fix}} \cdot M, \text{ and} \quad \text{Eq (6)}$$

$$T_{on} = R_{tune} \cdot C_{adj} \cdot M. \quad \text{Eq (7)}$$

Equation (7) indicates that the RC time constant for $R_{tune}$ and $C_{adj}$ is a function of $T_{on}$ and M, which are well controlled quantities. M may be selected based on the sizes of capacitors 414 and 420. $T_{on}$ may be determined based on an accurate clock, e.g., from a crystal oscillator. At the end of M discharge cycles, if the voltage $V_{out}$ at the output of amplifier 430 is positive, then capacitor 420 is too small, and a larger value may be selected for capacitor 420. Conversely, if $V_{out}$ is negative, then capacitor 420 is too large, and a smaller value may be selected for capacitor 420.

Figure 5:
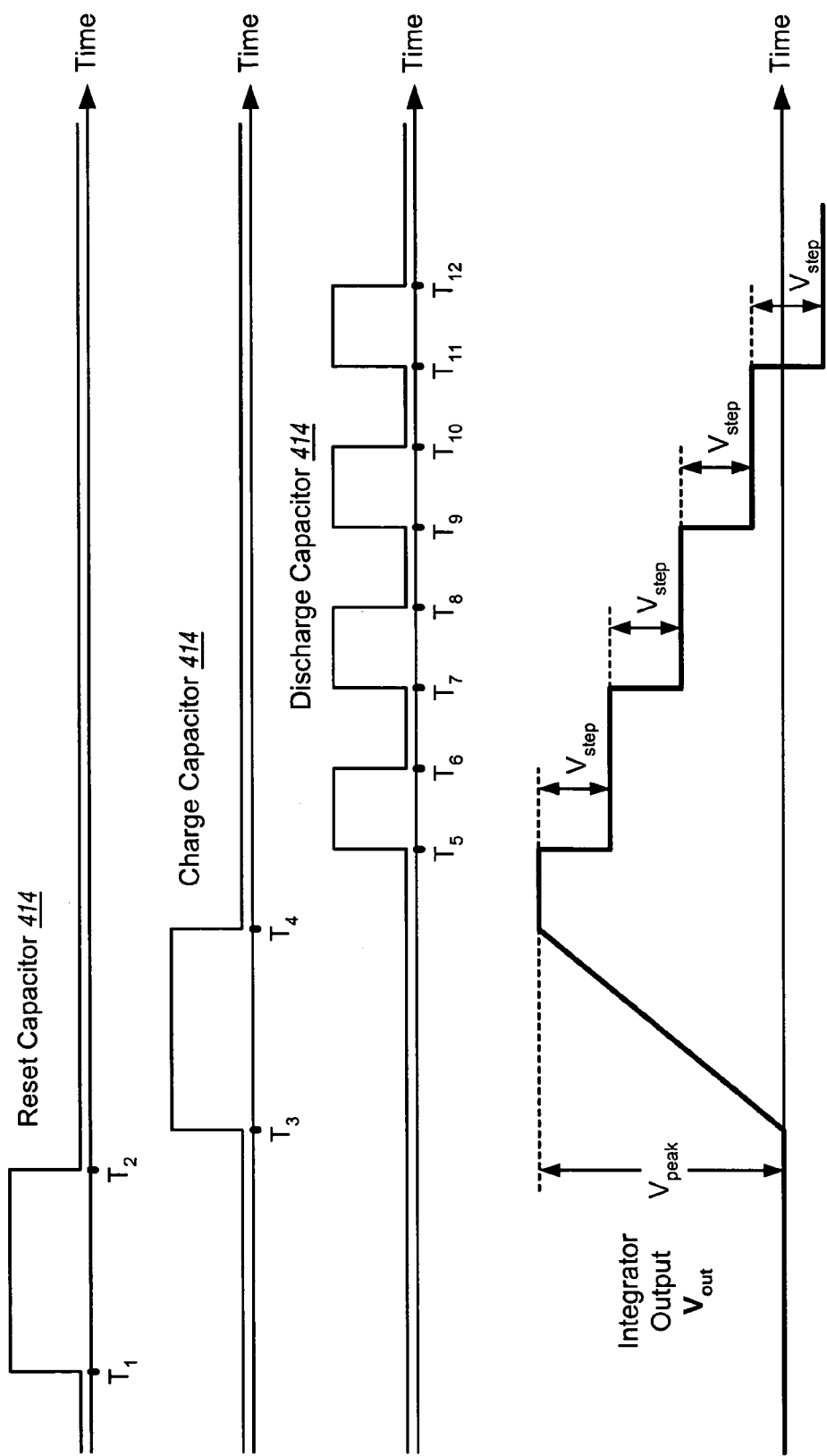
FIG. 5 shows a timing diagram for the RC tuner.

FIG. 5 shows a timing diagram for RC tuner 170 in FIG. 4. In this example, M=4 and capacitor 414 is discharged in four cycles. Between times $T_1$ and $T_2$, switch 416 is closed, and capacitor 414 is discharged. Between times $T_3$ and $T_4$, switch 412 is closed, and capacitor 414 is charged to $V_{peak}$ via resistor 410. For the first discharge cycle, between times $T_4$ and $T_5$, switches 422 and 428 are closed, and capacitor 420 is charged to $V_{ref}$. Between times $T_5$ and $T_6$, switches 424 and 426 are closed, capacitor 420 discharges capacitor 414, and the integrator output $V_{out}$ drops by $V_{step}$. For the second discharge cycle, between times $T_6$ and $T_7$, switches 422 and 428 are closed, and capacitor 420 is charged to $V_{ref}$. Between times $T_7$ and $T_8$, switches 424 and 426 are closed, capacitor 420 discharges capacitor 414, and $V_{out}$ drops by another $V_{step}$. $V_{out}$ drops by another $V_{step}$ at time $T_9$ for the third discharge cycle, and by another $V_{step}$ at time $T_{11}$ for the fourth discharge cycle. At the end of the four discharge cycles, $V_{out}$ is negative in this example, which indicates that capacitor 420 is too large.

Control unit 450 may perform a linear search, a binary search, or some other search to tune adjustable capacitor 420 to achieve the desired RC time constant. For a linear search, control unit 450 either (1) increases the value of capacitor 420 in small steps until $V_{out}$ is negative or (2) decreases the value of capacitor 420 in small steps until $V_{out}$ is positive. Control unit 450 may set capacitor 420 to $C_{min}$, charge and discharge capacitor 414 as described above, determine whether $V_{out}$ is positive or negative, select the next larger value for capacitor 420 if $V_{out}$ is positive, and repeat the tuning process until $V_{out}$ is negative. For a binary search, control unit 450 adjusts capacitor 420 in progressively smaller steps until all bits are evaluated. Control unit 450 may initially set capacitor 420 to a mid value between $C_{min}$ and $C_{max}$, charge and discharge capacitor 414, determine whether $V_{out}$ is positive or negative, set capacitor 420 to a larger value if $V_{out}$ is negative, set capacitor 420 to a smaller value if $V_{out}$ is positive, and repeat the tuning process for the next bit. For both searches, after completing the search, control unit 450 provides a C code that indicates both the setting and the value of adjustable capacitor

420 for a tuned capacitor. The RC time constant for the tuned capacitor and the tuned resistor is close to the desired RC time constant.

In the embodiment shown in FIG. 4, the RC time constant for $R_{tune}$ and $C_{tune}$ has a residual error of up to one least significant bit (LSB) because comparator 440 only detects whether $V_{out}$ is positive or negative. The residual RC error may be centered at ±½ LSB in several manners. In one embodiment, after capacitor 420 has been adjusted to within one LSB accuracy with an initial C code, capacitor 420 is increased by ½ LSB, and the RC tuning is performed once more. If $V_{out}$ is negative, which indicates that capacitor 420 is too large, then the initial C code is provided as the final C code. However, if $V_{out}$ is positive, which indicates that capacitor 420 is too small even with the ½ LSB of additional capacitance, then the initial C code is increased by one LSB and provided as the final C code. In another embodiment, $V_{out}$ after the last discharge cycle for the initial C code is compared against a threshold voltage, and the initial C code may be increased by one LSB based on the comparison result.

FIG. 6A illustrates tuning of adjustable capacitor 420 without the final ½ LSB tuning. In the example shown in FIG. 6A, 'A' is the target value, capacitor 420 is too small with a code of '01' (binary) and is too large with a code of '10'. Code '01' is provided as the C code. The error is almost one LSB in this example.

FIG. 6B illustrates tuning of adjustable capacitor 420 with the final ½ LSB tuning. After determining that capacitor 420 is too small with a code of '01' and is too large with a code of '10', capacitor 420 is increased by ½ LSB, and the RC tuning is performed once more. In this example, capacitor 420 is smaller than target value A with the additional ½ LSB of capacitance. Hence, one LSB is added to code '01', and code '10' is provided as the final C code. If 'B' was the target value, then capacitor 420 is larger than target value B with the additional ½ LSB of capacitance, and code '01' is provided as the final C code. By checking capacitor 420 with an additional ½ LSB of capacitance, the final C code results in capacitor 420 being within ±½ LSB of the target value.

FIG. 7 shows a schematic diagram of an embodiment of adjustable capacitor 420. In this embodiment, capacitor 420 is composed of L branches that are coupled in parallel. Each branch includes a capacitor 720 coupled in series with a switch 722. Different capacitor values may be obtained by turning on different switches 722 and selecting different branches. In an embodiment, the values of capacitors 720a through 720l are selected based on geometric progression. For example, capacitor 720a may be 2% larger than capacitor 720b, which may be 2% larger than the next capacitor, and so on. In another embodiment, capacitors 720a through 720l are binary weighted, so that capacitor 720a is two times larger than capacitor 720b, which is two times larger than the next capacitor, and so on. In yet another embodiment, capacitors 720a through 720l are thermometer decoded or linear weighted, so that all L capacitors 720a through 720l have unit capacitance. Adjustable capacitor 420 may also be implemented with other topology and/or other values.

For adjustable capacitor 420, the number of capacitors and the values of the capacitors may be selected based on the maximum variation in capacitance, the worst case residual error from the resistor tuning, the desired accuracy for the tuned capacitor, and the adjustable capacitor design (e.g., geometric progression, binary weighting, or thermometer decoding). For example, if the maximum variation in capacitance is 15%, the worst case residual error is 3%, and the desired capacitor accuracy is 2%, then adjustable capacitor 420 may be implemented with nine capacitors with geometric progression or four capacitors with binary weighting.

The resistors and capacitors in various circuits within transceiver 120 in FIG. 1 may be adjusted based on the R code from R tuner 160 and the C code from RC tuner 170. Some exemplary circuits that may be tuned based on the R and C codes are described below.

Figure 8A:
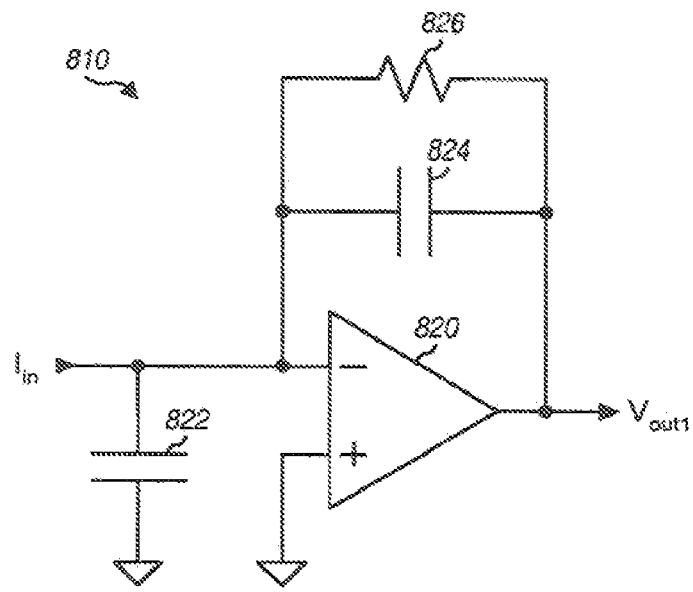
FIG. 8A shows a schematic diagram of a first order active RC filter.

FIG. 8A shows a schematic diagram of an embodiment of a first order active RC filter 810 that implements a single real pole. For filter 810, a capacitor 822 is coupled between the inverting input of a trans-resistance amplifier 820 and circuit ground. A capacitor 824 and a resistor 826 are coupled in parallel and between the inverting input and the output of amplifier 820. Amplifier 820 receives an $I_{in}$ input current at the inverting input and provides a $V_{out1}$ output voltage for filter 810. Resistor 826 may be adjusted based on the R code from R tuner 160 and would then be accurate to within the target percentage for the resistor, e.g., 2 to 3%. Capacitors 822 and 824 may be adjusted based on the C code from RC tuner 170, and the RC time constant for filter 810 would be accurate to within the target percentage for the RC time constant, e.g., 2%.

Figure 8B:
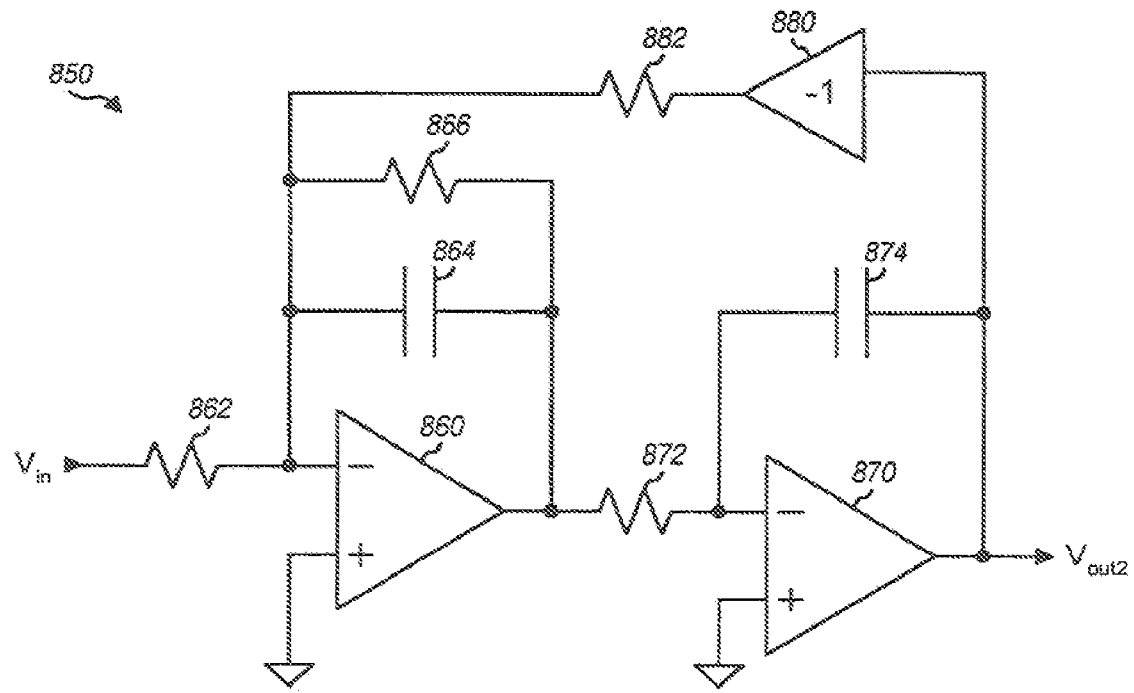
FIG. 8B shows a schematic diagram of a second order active RC filter.

FIG. 8B shows a schematic diagram of an embodiment of a second order active RC filter 850 that implements a biquadratic cell with two complex poles. For filter 850, a resistor 862 is coupled between the inverting input of an amplifier 860 and a $V_{in}$ input voltage. A capacitor 864 and a resistor 866 are coupled in parallel and between the inverting input and the output of amplifier 860. A resistor 872 is coupled between the output of amplifier 860 and the inverting input of an amplifier 870. A capacitor 874 is coupled between the inverting input and the output of amplifier 870. An inverter 880 has its input coupled to the output of amplifier 870. A resistor 882 is coupled between the output of inverter 880 and the inverting input of amplifier 860. Amplifier 870 provides a $V_{out2}$ output voltage for filter 850.

Resistor(s) 862, 866, 872 and/or 882 may be adjusted based on the R code from R tuner 160 and may be accurate to within the target percentage for the resistor(s). Capacitor(s) 864 and/or 874 may be adjusted based on the C code from RC tuner 170, and the RC time constant for filter 850 may be accurate to within the target percentage for the RC time constant.

Higher order active RC filters may be implemented with one or more filter sections. For example, a fifth order Chebyshev filter may be implemented with one first order filter section 810 and two second order filter sections 850. The real and complex poles may be designed to achieve the desired filter characteristics and may be obtained by adjusting the resistors and capacitors of the filter based on the R code and the C code, respectively. Active RC filter(s) 810 and/or 850 may be used for lowpass filter(s) 124 and/or 150 in FIG. 1.

Figure 9:
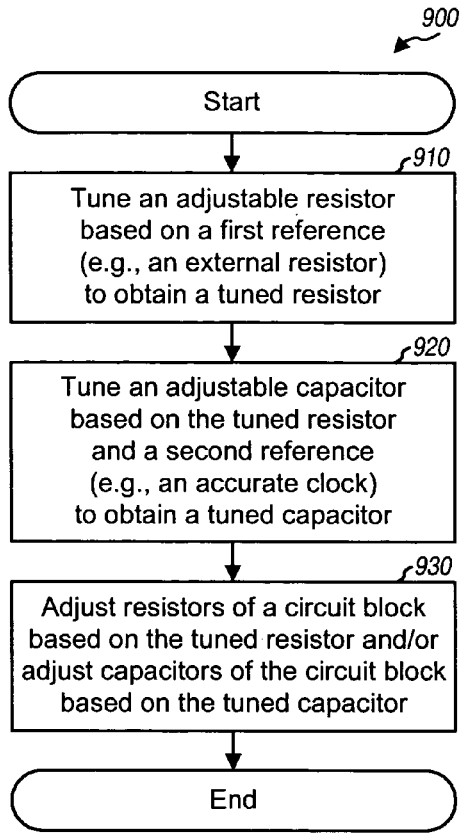
FIG. 9 shows a two-step tuning process.

FIG. 9 shows an embodiment of a two-step tuning process 900. An adjustable resistor is tuned based on a first reference to obtain a tuned resistor (block 910). The first reference may be an external resistor or some other quantity. An adjustable capacitor is tuned based on the tuned resistor and a second reference to obtain a tuned capacitor (block 920). The second reference may be an accurate clock or some other quantity. Resistors of a circuit block may be adjusted based on the tuned resistor (block 930). Capacitors of the circuit block may be adjusted based on the tuned capacitor (also block 930). The circuit block may be an active RC filter or some other type of circuit.

Figure 10:
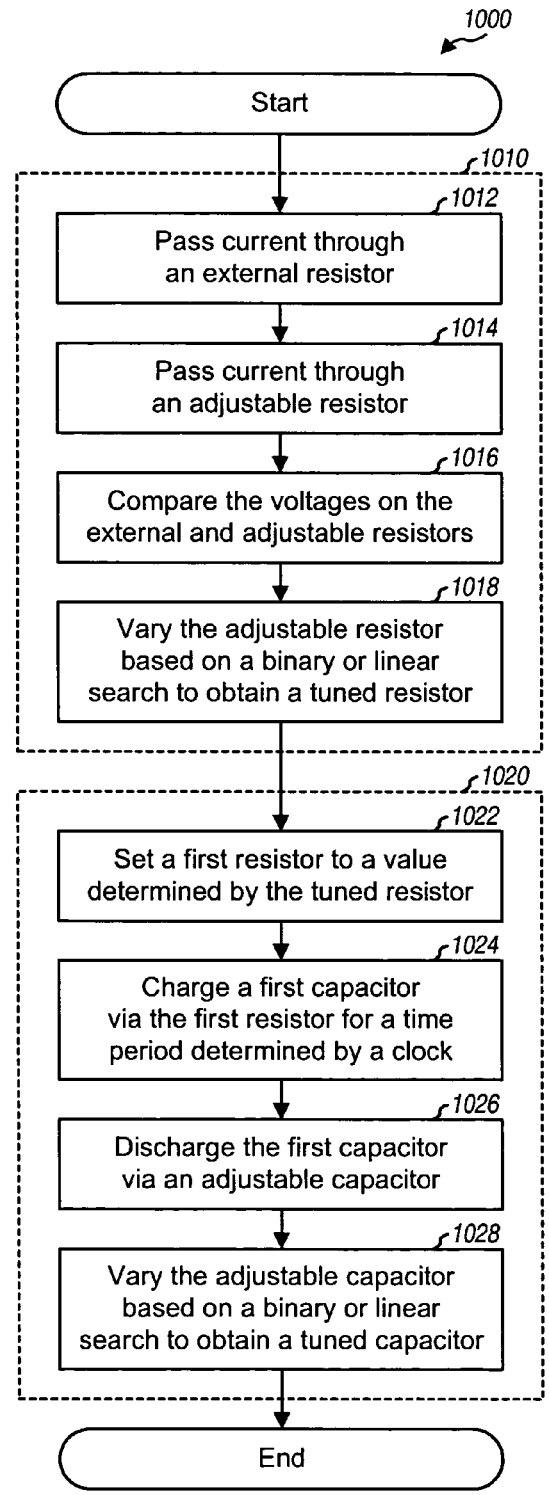
FIG. 10 shows a process to tune resistor and capacitor.

FIG. 10 shows an embodiment of a process 1000 to tune resistor and capacitor. An adjustable resistor is tuned based on an external resistor (block 1010). For block 1010, current from a first current source is passed through the external resistor (block 1012), current from a second current source is passed through the adjustable resistor (block 1014), and the voltages on the external and adjustable resistors are compared (block 1016). The adjustable resistor is varied based on a binary or linear search to obtain a tuned resistor having a value that is close to the external resistor value (block 1018).

An adjustable capacitor is tuned based on the tuned resistor and an accurate clock (block 1020). For block 1020, a first resistor (e.g., resistor 410 in FIG. 4) is set to a value determined by the tuned resistor (block 1022). A first capacitor (e.g., capacitor 414 in FIG. 4) is charged via the first resistor for a time period determined by the accurate clock (block 1024). The first capacitor is then discharged via the adjustable capacitor (block 1026). The adjustable capacitor is varied based on a binary or linear search to obtain a tuned capacitor such that the RC time constant for the first resistor and the tuned capacitor is within a desired accuracy (block 1028). The adjustable capacitor may be tuned to within ±½ LSB of the target value as described above.

The two-step tuning process described herein provides several key advantages. First, significant saving in die area may be realized since the adjustable capacitor only needs to compensate for variations in capacitance instead of variations in both resistance and capacitance. Second, improved noise performance may be achieved with the two-step tuning process. The noise in a filter is approximately KT/C, where K is Boltzman constant, T is absolute temperature, and C is a capacitor value used in the filter. The two-step tuning process reduces the range of values for C, which in turn reduces variations in the noise generated in the filter.

The tuning techniques and circuits described herein may be used for various applications such as communication, networking, computing, consumer electronics, and so on. The tuning techniques and circuits may also be used in wireless communication systems such as a Code Division Multiple Access (CDMA) system, a Time Division Multiple Access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a wireless local area network (WLAN), and so on.

The tuning techniques and circuits described herein may be implemented by various means. For example, the R tuner and RC tuner may be implemented within an IC, an RFIC, an analog IC, a digital IC, an application specific integrated circuit (ASIC), a digital signal processor (DSP), a processor, an electronic device, and so on.

Certain portions of the tuning techniques may be implemented with firmware and/or software. The firmware and/or software codes may be stored in a memory (e.g., memory 112 in FIG. 1) and executed by a processor (e.g., processor 110). The memory may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
 a first circuit configured to tune an adjustable resistor based on a first reference to provide a tuned resistor and to provide a resistance tuning signal indicative of a value of the tuned resistor; and
 a second circuit configured to tune an adjustable capacitor based on the tuned resistor in response to receiving the resistance tuning signal and a second reference to provide a tuned capacitor.

2. The integrated circuit of claim 1, wherein the first reference is an external resistor.

3. The integrated circuit of claim 2, wherein the first circuit comprises;
 a first current source coupled to the external resistor,
 a second current source coupled to the adjustable resistor, and
 a comparator coupled to the external and adjustable resistors and configured to compare voltages on the external and adjustable resistors.

4. The integrated circuit of claim 1, wherein the adjustable resistor comprises a plurality of resistors having values selected based on geometric progression.

5. The integrated circuit of claim 1, wherein the second circuit comprises a first integrator configured to charge a first capacitor via a first resistor having a value determined by the tuned resistor in response to the first resistor being adjusted by the resistance tuning signal, and
 a second integrator configured to discharge the first capacitor via the adjustable capacitor.

6. The integrated circuit of claim 5, wherein the second reference is a clock, and wherein the first integrator is configured to charge the first capacitor for a time period determined by the clock.

7. The integrated circuit of claim 1, wherein the second circuit is configured to tune the adjustable capacitor to within plus minus one half least significant bit (LSB) of error.

8. The integrated circuit of claim 7, wherein the second circuit is configured to obtain an initial code for the tuned capacitor, to evaluate the adjustable capacitor with an additional one half LSB of capacitance, and to provide the initial code or a next code as a final code for the tuned capacitor based on result of the evaluation.

9. The integrated circuit of claim 1, wherein the adjustable capacitor comprises a plurality of capacitors having binary weighted values.

10. The integrated circuit of claim 1, wherein the first circuit is configured to provide a first code, representing the resistance tuning signal, indicative of the value of the tuned resistor to adjust other resistors in the integrated circuit, and wherein the second circuit is configured to provide a second code indicative of a value of the tuned capacitor to adjust other capacitors in the integrated circuit.

11. The integrated circuit of claim 1, further comprising:
 a third circuit comprised of at least one resistor having value adjusted based on the tuned resistor.

12. The integrated circuit of claim 1, further comprising:
 a third circuit comprised of at least one capacitor having value adjusted based on the tuned capacitor.

13. The integrated circuit of claim 1, further comprising:
 an active RC filter comprised of at least one resistor having value adjusted based on the tuned resistor and at least one capacitor having value adjusted based on the tuned capacitor.

14. A method comprising:
tuning an adjustable resistor based on a first reference to provide a tuned resistor and to provide a resistance tuning signal indicative of a value of the tuned resistor; and
tuning an adjustable capacitor based on the tuned resistor in response to receiving the resistance tuning signal and a second reference to provide a tuned capacitor.

15. The method of claim 14, wherein the first reference is an external resistor, and wherein the tuning the adjustable resistor comprises
passing current through the external resistor,
passing current through the adjustable resistor, and
comparing voltages on the external and adjustable resistors.

16. The method of claim 14, wherein the second reference is a clock, and wherein the tuning the adjustable capacitor comprises
setting a first resistor to a value determined by the tuned resistor in response to the first resistor being adjusted by the resistance tuning signal,
charging a first capacitor via the first resistor for a time period determined by the clock, and
discharging the first capacitor via the adjustable capacitor.

17. The method of claim 14, wherein the tuning the adjustable capacitor comprises
obtaining an initial code for the tuned capacitor,
evaluating the adjustable capacitor with an additional one half least significant bit (LSB) of capacitance, and
providing the initial code or a next code as a final code for the tuned capacitor based on result of the evaluation.

18. The method of claim 14, further comprising:
adjusting at least one resistor of an active RC filter based on the tuned resistor, and
adjusting at least one capacitor of the active RC filter based on the tuned capacitor.

19. An apparatus comprising:
means for tuning an adjustable resistor based on a first reference to provide a tuned resistor and to provide a resistance tuning signal indicative of a value of the tuned resistor; and
means for tuning an adjustable capacitor based on the tuned resistor in response to receiving the resistance tuning signal and a second reference to provide a tuned capacitor.

20. The apparatus of claim 19, wherein the first reference is an external resistor, and wherein the means for tuning the adjustable resistor comprises:
means for passing current through the external resistor,
means for passing current through the adjustable resistor, and
means for comparing voltages on the external and adjustable resistors.

21. The apparatus of claim 19, wherein the second reference is a clock, and wherein the means for tuning the adjustable capacitor comprises:
means for setting a first resistor to a value determined by the tuned resistor in response to the first resistor being adjusted by the resistance tuning signal,
means for charging a first capacitor via the first resistor for a time period determined by the clock, and
means for discharging the first capacitor via the adjustable capacitor.

22. The apparatus of claim 19, wherein the means for tuning the adjustable capacitor comprises:
means for obtaining an initial code for the tuned capacitor,
means for evaluating the adjustable capacitor with an additional one half least significant bit (LSB) of capacitance, and
means for providing the initial code or a next code as a final code for the tuned capacitor based on result of the evaluation.

23. The apparatus of claim 19, further comprising:
means for adjusting at least one resistor of an active RC filter based on the tuned resistor, and
means for adjusting at least one capacitor of the active RC filter based on the tuned capacitor.

24. A wireless device comprising:
a first circuit configured to tune an adjustable resistor based on an external resistor to provide a tuned resistor and to provide a first code indicative of a value for the tuned resistor;
a second circuit configured to tune an adjustable capacitor based on the tuned resistor in response to receiving the first code and a reference clock and to provide a second code indicative of a value for a tuned capacitor; and
an active RC filter having at least one resistor adjusted based on the first code and at least one capacitor adjusted based on the second code.

* * * * *